(12) United States Patent
Page

(10) Patent No.: US 6,281,735 B1
(45) Date of Patent: Aug. 28, 2001

(54) VOLTAGE CLAMPING CIRCUITS FOR LIMITING THE VOLTAGE RANGE OF AN INPUT SIGNAL

(75) Inventor: Ronald William Page, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/599,620

(22) Filed: Jun. 22, 2000

Related U.S. Application Data
(60) Provisional application No. 60/153,013, filed on Sep. 9, 1999.

(51) Int. Cl.[7] .................................................. H03K 5/08
(52) U.S. Cl. .......................... 327/309; 327/180; 327/318; 361/91; 361/111
(58) Field of Search .................................... 327/309, 306, 327/310, 312, 313, 314, 318, 319, 320, 327, 328, 180, 419, 427; 361/56, 91, 111

(56) References Cited

U.S. PATENT DOCUMENTS

| | | | |
|---|---|---|---|
| 4,989,057 | * 1/1991 | Lu | 257/357 |
| 5,528,910 | * 6/1996 | Honningford | 327/328 |
| 5,530,612 | * 6/1996 | Maloney | 361/56 |
| 5,610,790 | * 3/1997 | Staab et al. | 361/56 |
| 5,708,550 | * 1/1998 | Avery | 361/56 |

* cited by examiner

*Primary Examiner*—Timothy P. Callahan
*Assistant Examiner*—Hai L. Nguyen
(74) *Attorney, Agent, or Firm*—Mark A. Dalla Valle; Wildman, Harrold, Alle & Dixon

(57) ABSTRACT

An input signal voltage clamping circuit that provides asymmetrical, or unipolar, voltage clamping for an input signal terminal of a circuit. For a circuit having a positive power supply voltage relative to its ground, or reference, terminal and an input signal having positive and negative signal peaks, the input signal terminal voltage is clamped at positive and zero voltage levels. The input signal terminal voltage is clamped at a positive clamp voltage level which is intermediate to the power supply and ground potentials when the input signal voltage is greater than such positive clamp voltage. The input signal terminal voltage is clamped at a zero volt level when the input signal voltage is negative.

13 Claims, 2 Drawing Sheets

VOLTAGE CLAMPING CIRCUITS FOR LIMITING THE VOLTAGE RANGE OF AN INPUT SIGNAL

RELATED APPLICATIONS

This application claims the benefit of U.S. Provisional application Ser. No. 60/153,013, filed Sept. 9, 1999. This application is also related to: U.S. patent application Ser. No. 09/599,380, filed on even date herewith, and entitled "Voltage Comparator Circuit With Hysteresis"; U.S. Pat. No. 6,208,094 entitled "Multiplexed Video Interface System"; and to U.S. Pat. No. 6,166,579 entitled "Digitally Controlled Signal Magnitude Control Circuit." The disclosure of each of the foregoing applications is incorporated herein by reference.

BACKGROUND OF THE INVENTION

1. Field of the Invention

The present invention relates to voltage clamping circuits for limiting the voltage range of a signal which would otherwise exceed predetermined maximum and minimum signal peaks, and in particular, to voltage clamping circuits that provide asymmetrical, or unipolar, voltage clamping.

2. Description of the Related Art

As integrated circuits become increasingly complex and the number of functions they perform become more numerous, it becomes increasingly important that such integrated circuits be capable of interfacing with signal sources that generate large or otherwise unusual signals. This is particularly true in mixed signal applications where the integrated circuit is often a digital circuit that operates with binary logic and is powered by a low voltage power supply and yet must be capable of dealing with analog signals which can exceed the voltage or current handling capabilities of the integrated circuit.

For example, integrated circuits for controlling video monitors that use cathode ray tubes (CRTs), such as those typically used with personal computers, must be able to work with many types of large signals. One example would be the horizontal and vertical flyback pulses generated during the horizontal and vertical retrace intervals, respectively, of the video display. Referring to FIG. 1, in the case of the horizontal flyback pulses, such pulses can be in the range of 100 volts peak-to-peak, with much of the signal being positive but also some of the signal being negative with respect to the system reference, or ground.

Referring to FIG. 2, the integrated circuit that must deal with such high magnitude signal pulses will have an internal amplifier stage A1 which is responsible for converting such pulses into a digital pulse stream. An external resister Rext will be used to limit the input current to the integrated circuit to a predetermined maximum positive value during the flyback interval and a predetermined negative value during the normal forward scan interval. Typically, diodes D1, D2 are also used at the input terminal to provide protection against electrostatic discharge (ESD) events in accordance with well-known techniques. The digital pulses HBLANK are for use elsewhere in the system for things such as blanking the video signal within the video amplifier and synchronizing a phase lock loop used in an on-screen display (OSD) generator.

Referring to FIG. 3, it is desirable that the digital output pulse HBLANK should trigger to its high signal state before the rising edge of the flyback pulse has passed through the zero volt level (time interval t1). Similarly, it is desirable that it then trigger to its low signal state soon after falling below the zero volt level (time interval t2).

Since the integrated circuits used in such an application are typically powered by a signal-ended power supply, such as a positive five volt power supply, it is important that the negative signal excursions of the input flyback signal HFLYBACK somehow be prevented from affecting the input terminal of the integrated circuit. As is well know, such negative signal excursions can cause current to flow within the substrate of the integrated circuit due to a reverse current flow at the input terminal. Accordingly, it would be desirable to have some form of voltage clamping circuit which provides asymmetrical, or unipolar, clamping of the input signal to prevent a negative voltage from appearing at the input terminal notwithstanding any negative voltage excursions of the input signal. (The term unipolar as used herein in intended to mean those signals having peak values within the range of zero to a positive voltage, inclusive, or zero to a negative voltage, inclusive.)

SUMMARY OF THE INVENTION

An input signal voltage clamping circuit in accordance with the present invention provides asymmetrical, or unipolar, voltage clamping for an input signal terminal of a circuit. For a circuit having a positive power supply voltage relative to its ground, or reference, terminal and an input signal having positive and negative signal peaks, the input signal terminal voltage is clamped at positive and zero voltage levels. The input signal terminal voltage is clamped at a positive clamp voltage level which is intermediate to the power supply and ground potentials when the input signal voltage is greater than such positive clamp voltage. The input signal terminal voltage is clamped at a zero volt level when the input signal voltage is negative.

An input signal voltage clamping circuit in accordance with one embodiment of the present invention includes first and second power terminals, an input signal terminal, first and second input clamping circuits and a bias circuit. The first and second power terminals are for conveying a power supply voltage with the second power terminal having a power supply voltage magnitude and polarity relative to the first power terminal;. The input signal terminal is for conveying an input signal having an input signal magnitude with opposing peak signal magnitude values that have positive and negative polarities relative to the first power terminal. The first input clamping circuit, coupled between the input signal terminal and the first power terminal, clamps the input signal terminal at a first clamped voltage in response to reception of the input signal, wherein: the first clamped voltage has a nonzero magnitude which is less than the power supply voltage magnitude and a same polarity as the power supply voltage relative to the first power terminal; and the received input signal has magnitude values which are greater than the first clamped voltage and a same polarity as the first clamped voltage relative to the first power terminal. The bias circuit, coupled to at least one of the first and second power terminals, provides a bias signal in response to reception of a bias current. The second input clamping circuit, coupled between the bias circuit, the input signal terminal and the second power terminal, clamps the input signal terminal at a second clamped voltage in response to reception of the bias signal and reception of the input signal, wherein: the second clamped voltage is substantially zero relative to the first power terminal; and the received input signal has magnitude values which are nonzero and an opposite polarity as the first clamped voltage relative to the first power terminal.

A method for clamping an input signal voltage of a circuit in accordance with another embodiment of the present invention includes the steps of:

receiving a power supply voltage via first and second power terminals with the second power terminal having a power supply voltage magnitude and polarity relative to the first power terminal;

receiving, via an input signal terminal, an input signal having an input signal magnitude with opposing peak signal magnitude values that have positive and negative polarities relative to the first power terminal;

clamping the input signal terminal at a first clamped voltage in response to reception of the input signal, wherein the first clamped voltage has a nonzero magnitude which is less than the power supply voltage magnitude and a same polarity as the power supply voltage relative to the first power terminal, and the received input signal has magnitude values which are greater than the first clamped voltage and a same polarity as the first clamped voltage relative to the first power terminal;

generating a bias signal; and clamping the input signal terminal at a second clamped voltage in response to reception of the bias signal and reception of the input signal, wherein the second clamped voltage is substantially zero relative to the first power terminal, and the received input signal has magnitude values which are nonzero and an opposite polarity as the first clamped voltage relative to the first power terminal.

DETAILED DESCRIPTION OF THE INVENTION

Figure 4:
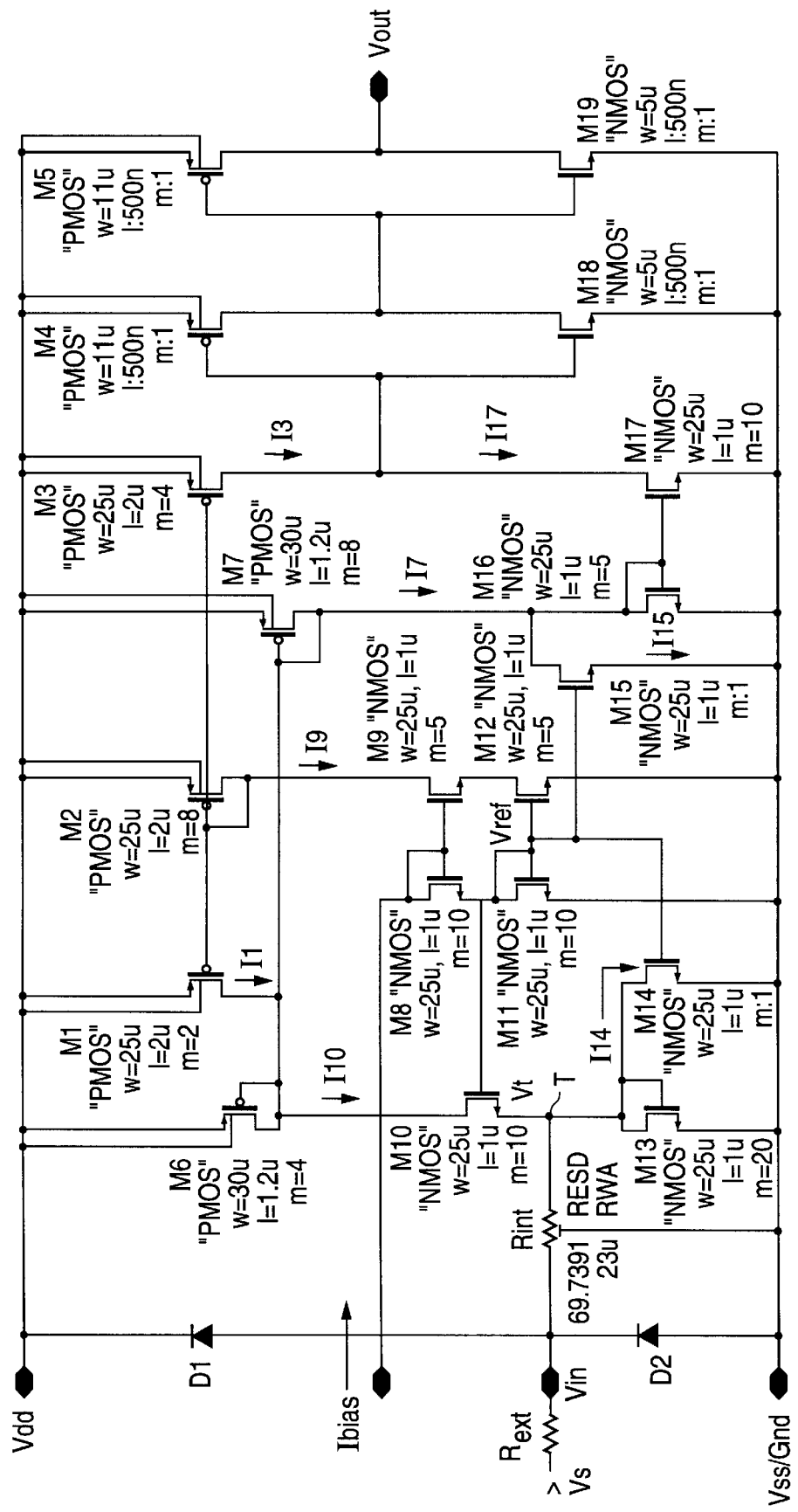
FIG. 4 is a schematic diagram of a voltage clamping circuit in accordance with one embodiment of the present invention.

Referring to FIG. 4, a voltage clamping circuit in accordance with one embodiment of the present invention is configured as shown and can be described as follows. Power supply terminals Vdd and Vss/Gnd provide the power supply voltage to the circuit, with terminal Vss/Gnd serving as the reference, or ground, terminal and terminal Vdd serving as the positive power supply voltage terminal (e.g., +5 volts). (It should be recognized, however, that as an alternative, the system can also be based on a negative power supply voltage with terminal Vdd serving as the reference terminal and Vss serving as the negative power supply voltage terminal.) An input bias current Ibias (which can, though need not, be externally generated) is supplied as the drain current for transistor M8. An input signal voltage Vin, which originates as a current limited signal voltage Vs via an external resister Rext, arrives at the node connecting the ESD diodes D1, D2 and a low value internal resistor Rint. This results, as will be described in more detail below, in a clamped input voltage Vt at terminal T. The output signal Vout is a digital signal with peak voltage excursions between the potentials of Vdd and Vss/Gnd and has high and low signal states that correspond to the high and low signal states of the input voltage Vin, respectively. For example, in the case of using such a circuit to detect and identify horizontal flyback pulses (as discussed above), the output signal voltage Vout will be at a logic high during the horizontal flyback interval, and will be at a logic low during the horizontal scanning interval.

As shown, the circuit of FIG. 4 is implemented using metal oxide semiconductor field effect transistors (MOSFETs) of both PMOS and NMOS types. However, it will be recognized that the principles of the invention can be realized with a bipolar junction transistor (BJT) implementation as well, with PNP and NPN transistors used in place of PMOS and NMOS transistors, respectively, in accordance with well known design techniques.

Transistors M2, M6, M8, M11, M13 and M16 are diode-connected, while the remaining transistors are used as three terminal devices. Accordingly, transistors M2, M1 and M3 operate together as a current mirror circuit as do transistors M16 and M17. Similarly, transistors M8 and M9 and transistors M11 and M12 operate together as stacked, or telescopically connected, current mirror circuits. Transistor M11 also operates together with transistors M14 and M15 to form additional current mirror circuits for generating shunting currents, as will be discussed in more detail below.

Transistors M4 and M18 and transistors M5 and M19 operate together as inverter circuits to provide successive buffering and logic level inversions of the voltage signal appearing at the drain terminals of transistors M3 and M17 to form the output voltage signal Vout.

The input bias current Ibias provides the drain current for transistors M8 and M11 which results in a reference voltage Vref appearing at the gate terminals of transistors M11, M12, M10, M14 and M15. This bias current Ibias is replicated, or mirrored, as the drain current I9 of transistor M9. (The relative channel widths of transistors M8 and M9 in this implementation will produce a current ratio of Ibias:I9=2:1.) In turn, this current 19 is further mirrored (and scaled according to the respective channel widths) by transistors M1 and M3 to produce corresponding drain currents I1 and I3, respectively.

Figure 1:
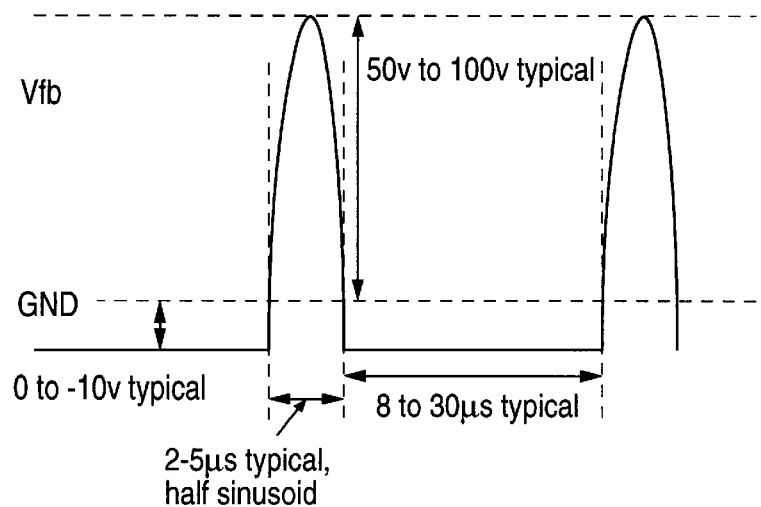
FIG. 1 is a signal diagram depicting typical horizontal flyback pulses for a video monitor using a CRT.
Figure 2:
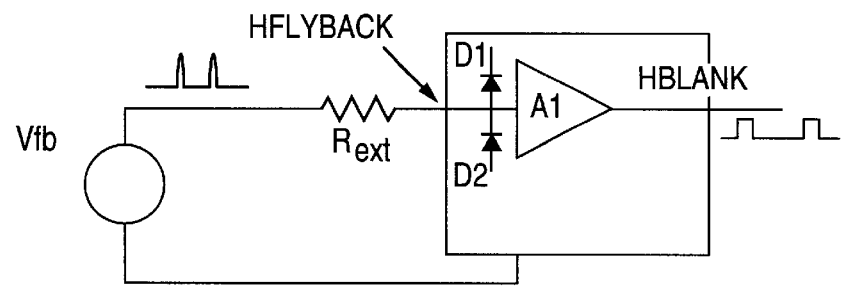
FIG. 2 is a functional block diagram of a mixed signal system in which large bipolar analog signals, such as horizontal flyback pulses, are converted to unipolar digital signal pulses.
Figure 3:
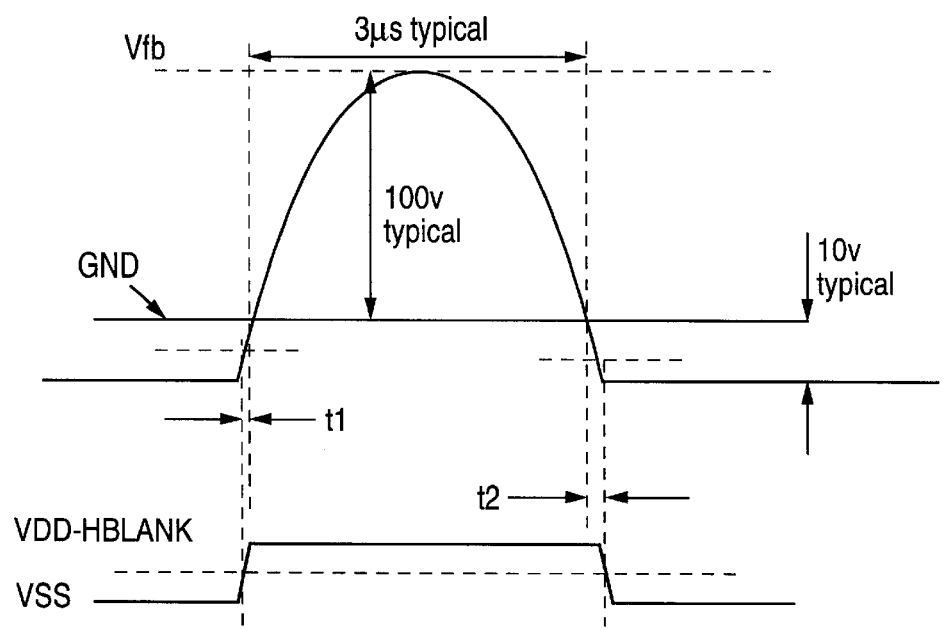
FIG. 3 is signal diagram depicting the desired relationship between the input and output signals for the system of FIG. 2.

When a current is applied to the input terminal T (limited in magnitude by the external Rext and internal Rint resistors) the voltage Vt at terminal T will be limited in magnitude by transistor M13 for positive magnitudes and transistor M10 for negative magnitudes (e.g., such as those experienced during the reception of a horizontal flyback pulse as depicted in FIGS. 1 and 3). During reception of a positive input current due to a positive input signal Vs, diode-connected transistor M13 will limit the voltage Vt at the input terminal T to approximately one volt. Meanwhile, transistor M10 will be in an off state since this voltage Vt at its source terminal is substantially equal to the reference voltage Vref generated by diode-connected transistor M11 (as discussed above), thereby making the gate-to-source voltage Vgs of transistor M10 substantially equal to zero volts. With no drain current I10 through transistor M10, current mirror transistors M6 and M7 will also be off, thereby causing current I7 and, therefore, current I17 to be zero. Accordingly, transistor M3 will turn on transistor M18 which, in turn, will turn on transistor M5, thereby producing a high output voltage Vout. (In the case of horizontal flyback detection, this will correspond to the horizontal flyback interval.)

When a current is drawn out from the input terminal T, i.e., when the current-limited input signal Vs is negative, transistor M13 is turned off and transistor M10 is turned on. This causes the voltage at the input terminal T to be clamped substantially at zero volts (the actual voltage may be on the order of tens of millivolts) since the gate-to-source voltage Vgs of transistor M10 is substantially equal but opposite in polarity to the reference voltage Vref at the gate terminal of transistor M10. The resulting drain current I10 through transistor M10 is then mirrored (via transistors M6 and M7) to produce current I7 which, in turn, is further mirrored to produce current I17. This current I17 will be larger than current I3 from transistor M3. Accordingly, transistor M17 will dominate and cause transistors M4 and M19 to be turned on and transistors M18 and M5 to be turned off, thereby producing a low output voltage Vout. (In the case of a horizontal flyback detection circuit, this will correspond to the horizontal scanning interval.)

As noted above, transistors M8, M9, M11 and M12 are biased by the bias current Ibias, thereby producing reference current I9 and reference voltage Vref. Due to current mirror action, this allows transistors M1, M14 and M15 to provide constant shunting currents I1, I14, I15 that ensure fast turn-off characteristics for the devices to which they are connected in shunt, i.e., transistors M6, M13 and M16, respectively.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an input signal voltage clamping circuit, comprising:

first and second power terminals for conveying a power supply voltage with said second power terminal having a power supply voltage magnitude and polarity relative to said first power terminal;

an input signal terminal for conveying an input signal having an input signal magnitude with opposing peak signal magnitude values that have positive and negative polarities relative to said first power terminal;

a first input clamping circuit, coupled between said input signal terminal and said first power terminal, that clamps said input signal terminal at a first clamped voltage in response to reception of said input signal, wherein said first clamped voltage has a nonzero magnitude which is less than said power supply voltage magnitude and a same polarity as said power supply voltage relative to said first power terminal, and said received input signal has magnitude values which are greater than said first clamped voltage and a same polarity as said first clamped voltage relative to said first power terminal;

a bias circuit, coupled to at least one of said first and second power terminals, that provides a bias signal in response to reception of a bias current; and a second input clamping circuit, coupled between said bias circuit, said input signal terminal and said second power terminal, that clamps said input signal terminal at a second clamped voltage in response to reception of said bias signal and reception of said input signal, wherein said second clamped voltage is substantially zero relative to said first power terminal, and said received input signal has magnitude values which are nonzero and an opposite polarity as said first clamped voltage relative to said first power terminal.

2. The apparatus of claim 1, wherein said first input clamping circuit comprises a diode.

3. The apparatus of claim 2, wherein said diode comprises a diode-connected transistor.

4. The apparatus of claim 1, wherein said bias circuit comprises a diode.

5. The apparatus of claim 4, wherein said diode comprises a diode-connected transistor.

6. The apparatus of claim 1, wherein said bias circuit comprises a current mirror circuit, coupled between said first and second power terminals, that provides a bias voltage as said bias signal in response to reception of said bias current.

7. The apparatus of claim 1, wherein said second input clamping circuit comprises a transistor with a bias terminal coupled to said bias circuit and a signal terminal coupled to said input signal terminal.

8. The apparatus of claim 1, wherein said bias circuit and said second input clamping circuit together comprise a current mirror circuit.

9. The apparatus of claim 1, further comprising a current shunting circuit, coupled to said bias circuit and across said first input clamping circuit, that conducts a shunt current in response to said bias signal when said first input clamping circuit is substantially turned off.

10. The apparatus of claim 9, wherein said bias circuit and said current shunting circuit together comprise a current mirror circuit.

11. An apparatus including an input signal voltage clamping circuit, comprising:

first and second power means for conveying a power supply voltage with said second power terminal having a power supply voltage magnitude and polarity relative to said first power terminal;

input signal means for conveying an input signal having an input signal magnitude with opposing peak signal magnitude values that have positive and negative polarities relative to said first power terminal;

first input clamping means for clamping said input signal terminal at a first clamped voltage in response to reception of said input signal, wherein said first clamped voltage has a nonzero magnitude which is less than said power supply voltage magnitude and a same polarity as said power supply voltage relative to said first power terminal, and said received input signal has magnitude values which are greater than said first clamped voltage and a same polarity as said first clamped voltage relative to said first power terminal;

bias means for providing a bias signal; and second input clamping means for clamping said input signal terminal at a second clamped voltage in response to reception of said bias signal and reception of said input signal, wherein said second clamped voltage is substantially zero relative to said first power terminal, and said received input signal has magnitude values which are nonzero and an opposite polarity as said first clamped voltage relative to said first power terminal.

12. The apparatus of claim 11, further comprising current shunting means for conducting a shunt current in response to said bias signal when said first input clamping circuit is substantially turned off.

13. A method for clamping an input signal voltage of a circuit, comprising the steps of:

receiving a power supply voltage via first and second power terminals with said second power terminal having a power supply voltage magnitude and polarity relative to said first power terminal;

receiving, via an input signal terminal, an input signal having an input signal magnitude with opposing peak signal magnitude values that have positive and negative polarities relative to said first power terminal;

clamping said input signal terminal at a first clamped voltage in response to reception of said input signal, wherein said first clamped voltage has a nonzero magnitude which is less than said power supply voltage magnitude and a same polarity as said power supply voltage relative to said first power terminal, and said received input signal has magnitude values which are greater than said first clamped voltage and a same polarity as said first clamped voltage relative to said first power terminal;

generating a bias signal; and clamping said input signal terminal at a second clamped voltage in response to reception of said bias signal and reception of said input signal, wherein said second clamped voltage is substantially zero relative to said first power terminal, and said received input signal has magnitude values which are nonzero and an opposite polarity as said first clamped voltage relative to said first power terminal.

\* \* \* \* \*